United States Patent
Palmade

(10) Patent No.: US 9,619,746 B2
(45) Date of Patent: Apr. 11, 2017

(54) MICROELECTRONIC CHIP WITH MULTIPLE CONTACTS

(71) Applicant: STARCHIP, Meyreuil (FR)

(72) Inventor: Romain Pierre Palmade, Issy les Moulineaux (FR)

(73) Assignee: STARCHIP, Meyreuil (FR)

( * ) Notice: Subject to any disclaimer, the term of this patent is extended or adjusted under 35 U.S.C. 154(b) by 0 days.

(21) Appl. No.: 15/006,960

(22) Filed: Jan. 26, 2016

(65) Prior Publication Data

US 2016/0217363 A1    Jul. 28, 2016

(30) Foreign Application Priority Data

Jan. 27, 2015  (FR) ...................................... 15 50590

(51) Int. Cl.
*G06K 19/06*    (2006.01)
*G06K 19/077*    (2006.01)
(Continued)

(52) U.S. Cl.
CPC ... *G06K 19/07775* (2013.01); *G06K 19/0708* (2013.01); *G06K 19/0726* (2013.01);
(Continued)

(58) Field of Classification Search
CPC .............. G06K 19/0723; G06K 19/07; G06K 19/0708; G06K 19/0715; G06K 19/0726;
(Continued)

(56) References Cited

U.S. PATENT DOCUMENTS 8,915,448 B2 * 12/2014 Taniguchi .......... G06K 19/0723
235/487
9,048,526 B2 *  6/2015 Ito .................... G06K 19/07794
(Continued)

FOREIGN PATENT DOCUMENTS

EP          1538558      6/2005
WO       WO-9840846      9/1998
WO       WO-02089053    11/2002

OTHER PUBLICATIONS

French Search Report, dated Nov. 24, 2015, French Application No. 1550590.

*Primary Examiner* — Thien M Le
*Assistant Examiner* — April Taylor
(74) *Attorney, Agent, or Firm* — Blakely Sokoloff Taylor & Zafman LLP

(57) ABSTRACT

The invention concerns an electronic module (2) for a contactless smart card or dual contact and contactless smart card comprising at least a first antenna (3a), a second antenna (3b), a third antenna (3c) and a microelectronic chip (1), characterized in that:
said microelectronic chip comprises a microprocessor, at least a first contact (P1), a second contact (P2), a third contact (P3), a fourth contact (P4), a first tuning capacitor (C1) connected between the first contact (P1) and the third contact (P3), a second capacitor (C2) connected between the second contact (P2) and the fourth contact (P4), said first and third contacts (P1, P3) being connected to the inputs/outputs of the microprocessor and being configured to transmit to said microprocessor a radio-frequency communication signal exchanged through the antennas,
said first antenna (3a) is connected between the first contact (P1) and the third contact (P3) and is configured to be brought into resonance by said first capacitor (C1), (Continued)

said second antenna (3) is connected between the second contact (P2) and the fourth contact (P4) and is configured to be brought into resonance by said second capacitor (C2) in order to capture the energy transmitted by induction by a remote reader, said third antenna (3c) is connected in series with said second antenna (3) between the second contact (P2) and the fourth contact (P4) for transmitting the captured energy to the microelectronic chip (1) and coupled with the first antenna (3a) for transferring to the microelectronic chip (1) through the first antenna (3a) the energy captured by the second antenna (3b).

3 Claims, 4 Drawing Sheets

(51) Int. Cl.
*H01L 23/498* (2006.01)
*H01L 23/66* (2006.01)
*G06K 19/07* (2006.01)

(52) U.S. Cl.
CPC . *G06K 19/07766* (2013.01); *G06K 19/07767* (2013.01); *G06K 19/07769* (2013.01); *H01L 23/49855* (2013.01); *H01L 23/66* (2013.01); *H01L 2223/6672* (2013.01); *H01L 2223/6677* (2013.01); *H01L 2924/0002* (2013.01)

(58) Field of Classification Search
CPC ......... G06K 19/07749; G06K 19/0775; G06K 19/07766; G06K 19/07767; G06K 19/07769; G06K 19/07773; G06K 19/07775; G06K 19/07794
USPC .......................................... 235/492
See application file for complete search history.

(56) References Cited

U.S. PATENT DOCUMENTS

2007/0158438 A1\* 7/2007 Fukuda .............. G06K 19/0723 235/492
2015/0263412 A1\* 9/2015 Kimura ................ H01Q 1/2225 235/492

\* cited by examiner

-- PRIOR ART --

-- PRIOR ART --

MICROELECTRONIC CHIP WITH MULTIPLE CONTACTS

FIELD OF THE INVENTION

The invention concerns the field of smart cards or chip cards. More precisely, it concerns a chip of a contactless smart card or of a dual contact and contactless smart card.

BACKGROUND

Contactless smart cards are used to realize a short-range transmission of information between a reader and a chip integrated into an electronic module of the smart card without inserting the card in a reader and without any electrical connection between the reader and the metallic contacts of the electronic module.

To this end, a contactless smart card has an antenna connected to the chip for radiofrequency communication between the card and the card reader. Because a contactless smart card has neither energy source nor energy storage, such an antenna enables powering up the chip of the card be by induction.

Traditionally, such a smart card is in credit card format and the smart card antenna 3 is disposed on the substrate 4 of the card body, as illustrated on FIG. 1. The antenna is thus connected to the chip trough the electronic module 2. Such antenna has sufficient size for ensuring electrical power to the chip.

Nevertheless, constantly increasing the miniaturization of the electronics systems makes today necessary the integration of contactless chips into supports having much lower dimensions than those of a credit card. The antenna 3 connected to the chip 1 can no longer be placed into a card body and must be integrated into the electronic module 2, as illustrated on FIG. 2. The antenna is thus connected directly to two contacts La and Lb of the chip 1. The chip 1 also comprises a capacitor C used to bring the antenna into resonance. However, the small space available into such a module does not permit to include in it an antenna having the same size than those residing in existing contactless smart card bodies. The energy that an antenna integrated into an electronic module can collect will be much lower, perhaps too low to be sufficient for ensuring a correct power supply of the chip.

Therefore, there is a need for a system to ensure proper electric power supply to a contactless chip, while respecting the constraints of low available surface area imposed by the small dimensions of the electronic module in which the chip is integrated.

SUMMARY OF THE INVENTION

The present invention concerns according to a first aspect an electronic module for a contactless smart card or dual contact and contactless smart card comprising at least a first antenna, a second antenna a third antenna and a microelectronic chip, characterized in that:

said microelectronic chip comprises a microprocessor, at least a first contact, a second contact, a third contact, a fourth contact, a first tuning capacitor connected between the first contact and the third contact, a second capacitor connected between the second contact and the fourth contact, said first and third contacts being connected to the inputs/outputs of the microprocessor and being configured to transmit to said microprocessor a radio-frequency communication signal exchanged through the antennas, said first antenna is connected between the first contact and the third contact and is configured to be brought into resonance by said first capacitor, said second antenna is connected between the second contact and the fourth contact and is configured to be brought into resonance by said second capacitor in order to capture the energy transmitted by induction by a remote reader, said third antenna is connected in series with said second antenna between the second contact and the fourth contact for transmitting the captured energy to the microelectronic chip and coupled with the first antenna for transferring to the microelectronic chip through the first antenna the energy captured by the second antenna.

Said chip provides electrical assemblies permitting to ensure its electrical supply despite the small area available in the electronic module without requiring components outside thereof.

Such a module can have several antennas in two coupled circuits for increasing the amount of energy captured and transmitted to the chip.

Preferably, the second capacitor is a variable capacitor. Such a capacitor permits to bring into resonance efficiently a second antenna of the electronic module different from the first antenna brought into resonance by the first capacitor of the chip and to significantly increase the energy captured and transmitted to the chip.

Furthermore, the microelectronic chip comprises a variable resistor connected in series with the second capacitor between the second contact and the fourth contact. Such a variable resistor permits to reduce and adjust the quality factor of the circuit in which it is inserted, in order to adjust its bandwidth.

BRIEF DESCRIPTION OF THE DRAWINGS

Other features and advantages of the invention will appear in the following description. Embodiments of the invention will be described with reference to the drawings, in which.

DETAILED DESCRIPTION

Figure 1:
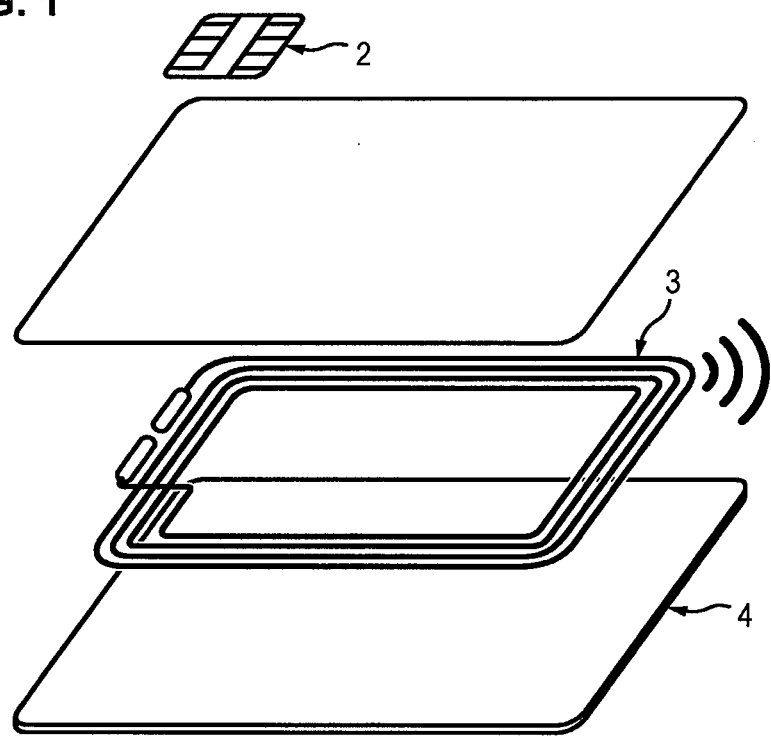
FIG. 1 illustrates a known smart card.
Figure 2:
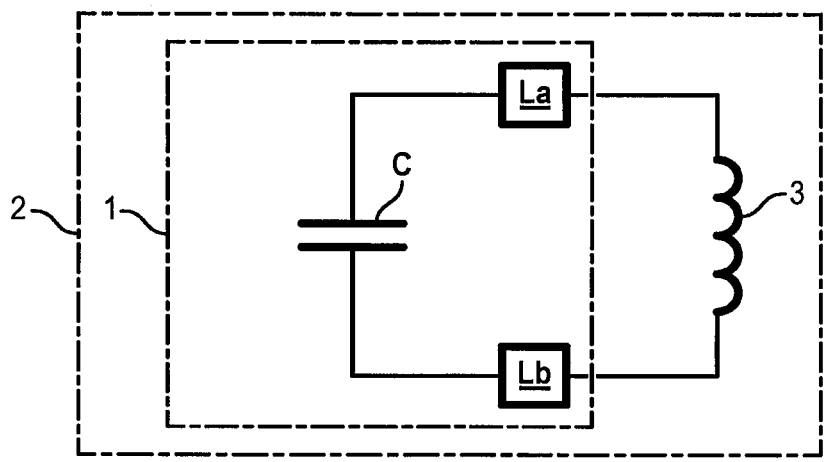
FIG. 2 illustrates a known microelectronic chip.
Figure 3:
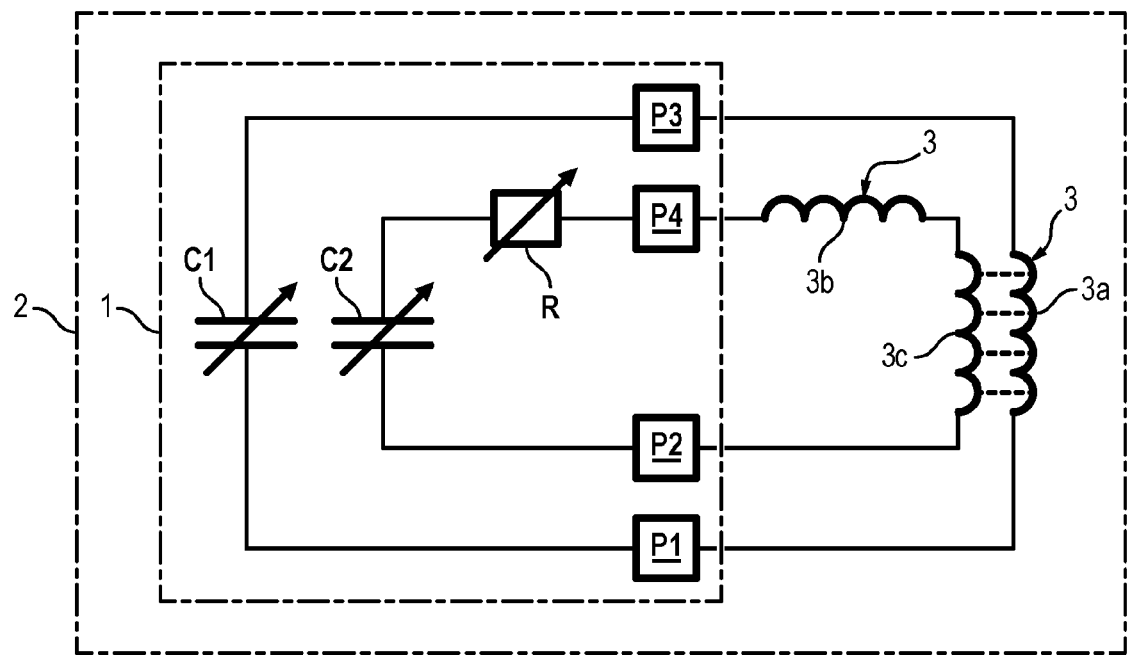
FIG. 3 illustrates a microelectronic chip according to a first embodiment of the invention.

The present invention concerns a microelectronic chip 1 for a contactless smart card or dual contact and contactless smart card as illustrated on FIG. 3.

Such a chip comprises at least a first contact P1 and a second contact P2. The chip 1 may be integrated into an electronic module 2 comprising at least one antenna 3 configured to be connected to the chip 1 through the contacts P1, P2 for ensuring a radiofrequency communication with a remote reader.

Said at least one antenna 3 enables to collect the energy transmitted by the remote reader by induction for powering up the chip 1. The energy captured by the antenna can be also transmitted to the chip through contacts P1, P2.

Within the chip, such energy is more specifically used for powering up the microprocessor and the other circuits of the chip to be powered up such as a memory or cryptoprocessor dedicated to accelerating cryptographic computations. To this end, the chip further comprises at least a third contact P3, and two contacts of the chip, for example the first and third contacts P1, P3, are connected to the inputs/outputs of the microprocessor and are therefore configured to transmit to said microprocessor the captured energy and a radiofrequency communication signal exchanged through the antennas.

The chip 1 also comprises two capacitors C1, C2 and at least one of its contacts, for instance the second contact P2, is separate and distinct from the two contacts connected to the inputs/outputs of the microprocessor. This contact and also at least another contact are configured to be connected to said at least one antenna 3 for insuring the loading by said antenna of the capacitors C1, C2. For example, the capacitor C1 may have a capacitance between 20 pF and 70 pF; and the capacitor C2, a capacitance between 100 pF and 200 pF.

The first and second contacts of the chip P1, P2 are conceived to be connected to the antenna 3 of the module and are therefore external connectors through which components outside the chip integrated on the electronic module may be connected to the chip. The other contacts of the chip can be external connectors as well, to which external components may connect. Alternatively, these other contacts may be only internal contacts of the chip, without any direct connection from the outside of the chip.

By "distinct and separate from the two contacts connected to the inputs/outputs of the microprocessor", we mean that the second contact P2 is not located at a point of the electrical circuit of the chip 1 whose potential is always equal to that of the contacts connected to the inputs/outputs of the microprocessor. This contact is thus neither physically identical nor directly connected by a wire within the chip to the contacts connected to inputs/outputs of the microprocessor. This does not preclude connections that can be made between the contacts outside of the chip in case where the third contact P2 is also an external connector.

Thus, the chip comprises at least three contacts including a first contact P1 and a second contact P2 in the form of external connectors, and a distinct third contact P2, connected to inputs/outputs of the microprocessor and that may itself be under the form of an external connector or not. Another contact of the chip is connected to the inputs/outputs of the microprocessor. This contact may be the first contact P1 or the second contact P2 or an additional contact under the form of an external connector or not.

When they are under the form of external connectors, the contacts connected to inputs/outputs of the microprocessor may also be connected to the at least one antenna 3 of the module.

In an example illustrated on FIG. 3, the third contact P3 is under the form of an external connector and the first contact P1 is connected to the inputs/outputs of the microprocessor.

As illustrated on FIG. 3, the chip 1 can comprise a fourth contact P4, the first capacitor C1 may be a tuning capacitor connected between the first and the third contacts P1, P3 and the second capacitor C2 may be connected between the second and fourth contacts P2, P4. A capacitance between 20 pF and 70 pF enables to bring into resonance an inductance L comprised between 1.5 µH et 6 µH.

Figure 4:
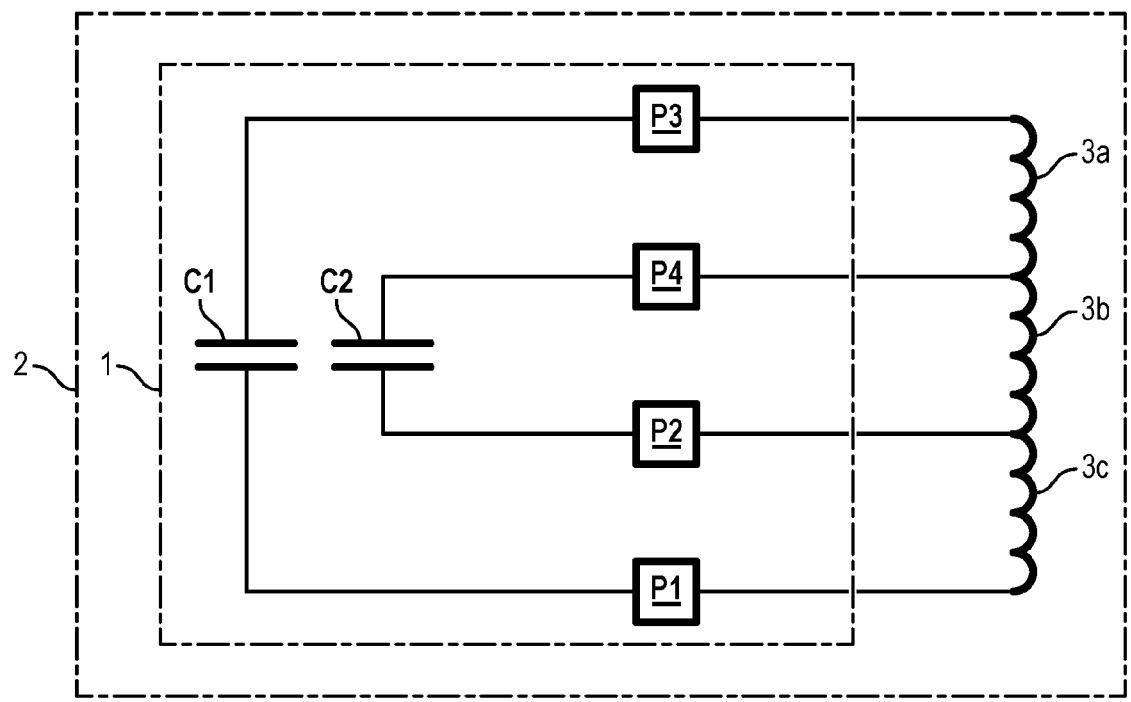
FIG. 4 illustrates a microelectronic chip according to a second embodiment of the invention.

As illustrated on FIGS. 3 and 4, said at least one antenna 3 may then be connected to the chip by four points of different potentials connected to said contacts P1, P2, P3, P4 for providing radiofrequency communication with a remote reader and for powering up the chip.

Providing within the chip two capacitors and at least three contacts disposed so that at least one of said contacts of the chip connected to the antenna 3 is not identical to any one of the two contacts connected to the inputs/outputs of the microprocessor enables to build different circuits interconnecting these capacitors with said at least one antenna 3 through the contacts in order to provide more energy than in the case of a direct connection of an antenna of the electronic module to the two contacts connected to the inputs/outputs of the microprocessor. The microprocessor can thus receive enough energy for a being properly powered up.

Providing four contacts enables for example to build two separate circuits, each including its own antenna and a capacitor for bringing it into resonance.

As illustrated on FIG. 3, the second capacitor C2 can be a variable capacitor, having for example a capacitance between 100 pF and 200 pF, so as to bring into resonance more easily an antenna connected between the second contact P2 and the fourth contact P4. The value of the capacitance C2 can be selected by the microprocessor depending on the value of the at least one antenna connected to the contacts of the chip.

Moreover, as illustrated on FIG. 3, the chip 1 can include a variable resistor R connected in series with the second capacitor C2 between the second contact P2 and the fourth contact P4. Such as in the case of a variable capacitance C2, the value of the resistor R can be selected by the microprocessor. Such a resistor in series enables lowering the quality factor of the circuit $Q=1/(4RC\omega)$ in order to increase its bandwidth $B=\omega/Q$, $\omega$ being the angular frequency of the signal.

According to a first example illustrated on FIG. 3, the electronic module includes a first antenna 3a connected between the first contact P1 and the third contact P3, which are also connected to the inputs/outputs of the microprocessor. This antenna is brought to resonance by the first capacitor C1, which is also connected between the first contact P1 and the third contact P3.

In order to increase the amount of energy collected at the electronic module and transmitted to the chip, the electronic module also includes a second antenna 3b, called booster antenna, connected between the second contact P2 and the fourth contact P4 of the chip. Such an antenna also collects the energy transmitted by induction par the reader, by being brought to resonance using the second capacitor, which is also connected between the second contact P2 and the fourth contact P4 of the chip. In order to transmit this energy to the chip, a third antenna 3c is connected in series with the booster antenna 3b between the second contact P2 and the fourth contact P4 of the chip. This third antenna is coupled to the first antenna 3a and enables to transfer the energy captured by the booster antenna 3b to the chip through the first antenna 3a. Connecting the antennas 3a, 3b, 3c to the chip through four contacts with different potentials enables to build two electrical circuits, each one including an antenna brought to resonance, and coupled to each other, thus increasing the energy captured by the electronic module and transmitted to the chip. Moreover, such antennas 3a, 3b, 3c can be antenna elements of a single antenna 3.

A comparison between a classical antenna with two antenna contacts and an antenna with four contacts was performed, the two antennas having identical overall surfaces. A measurement of the voltage and the power received by the chip showed that the antenna with four contacts gathers three times the power gathered by an antenna with two contacts. The voltage measured at the output of a diode bridge of the chip was also three times higher, which enables the chip to operate in a much larger range of electromagnetic field, and thus enables increasing significantly the operating distance.

According to a second example illustrated on FIG. 4, the chip 1 includes the same circuits as the configuration illustrated on FIG. 3 and the electronic module includes three antennas 3a, 3b, 3c connected respectively between the third contact P3 and the fourth contact P4, between the second contact P2 and the fourth contact P4, and between the first contact P1 and the second contact P2. In this example, the capacitor C1 is used as a tuning capacitor for the antennas and the capacitor C2 amplifies the energy captured by the antennas and delivered to the chip. Such antennas 3a, 3b, 3c can be antenna elements of a single antenna 3.

Figure 5:
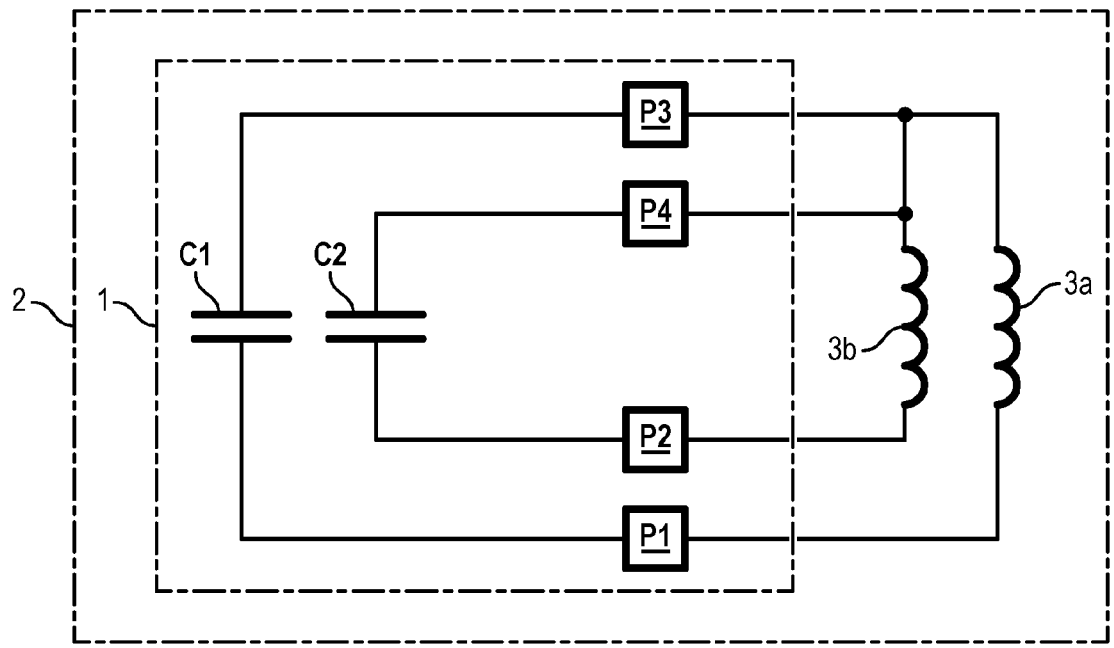
FIG. 5 illustrates a microelectronic chip according to a third embodiment of the invention.

A third configuration example is illustrated on FIG. 5, in which the chip 1 includes the same circuits as in the configuration illustrated on FIG. 3 and in which a first antenna 3a is connected between the first contact P1 and the third contact P3, and a second antenna 3b is connected between the second contact P2 and the fourth contact P4. In addition, the third contact P3 and the fourth contact P4 are connected by a wire. According to this example, as in the previous example, the capacitor C1 is used as a tuning capacitor for the antennas and the capacitor C2 amplifies the energy captured by the antennas and delivered to the chip. In addition, since the third contact P3 and the fourth contact are connected by a wire, they can be only one, and only three contacts are needed.

Figure 6:
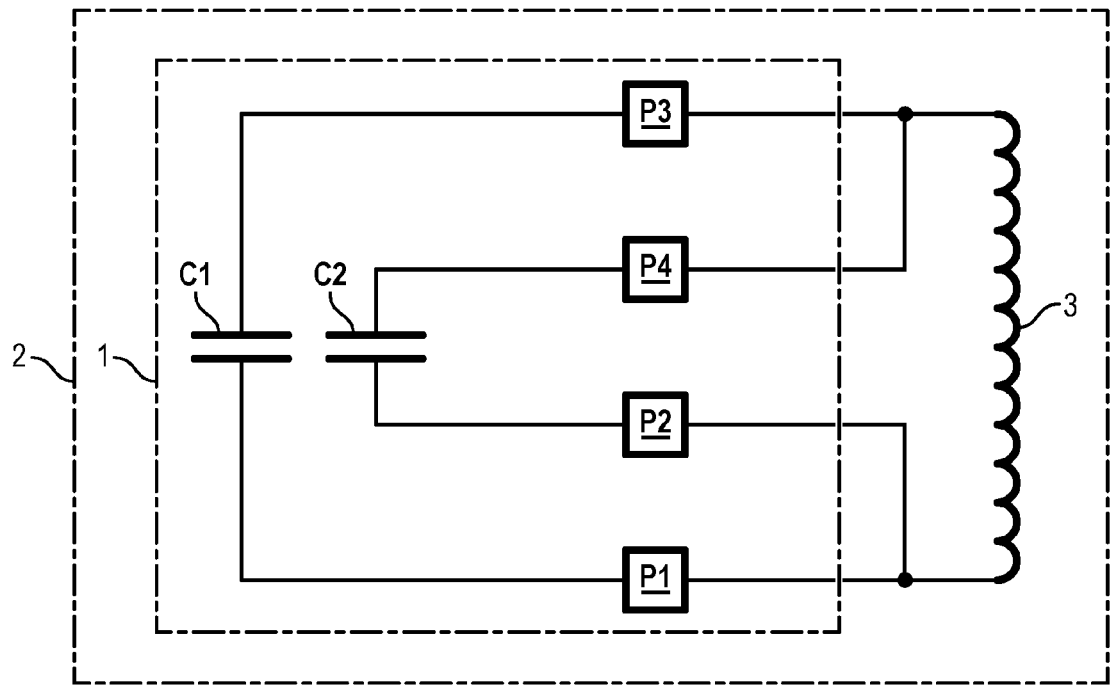
FIG. 6 illustrates a microelectronic chip according to a fourth embodiment of the invention.

A fourth configuration example is illustrated on FIG. 6 in which the chip 1 includes the same circuits as in the configuration illustrated on FIG. 3, and in which an antenna 3 is connected between the first contact P1 and the third contact P3, and in which the third contact P3 and the fourth contact P4 are connected by a wire, and in which the first contact P1 and the second contact P2 are connected by a wire. According to this example, capacitors C1 and C2 are used as tuning capacitors for the antenna 3. Mounting the capacitors in parallel enables having an overall tuning capacitor with a capacitance value equal to C1+C2.

According to another embodiment, the chip 1 can include a first tuning capacitor C1 connected between the first contact P1 and the third contact P3, connected to the inputs/outputs of the microprocessor, and a second capacitor C2 connected to the second contact P2 and the third contact P3, in such a way that, when said antenna 3 is connected between the first contact P1 and the second contact P2, the first tuning capacitor C1 is connected between said first contact P1 and third contact P3 in parallel with said at least one antenna, and said second capacitor C2 is connected between said first contact P1 and third contact P3 in series with said at least one antenna.

Figure 7:
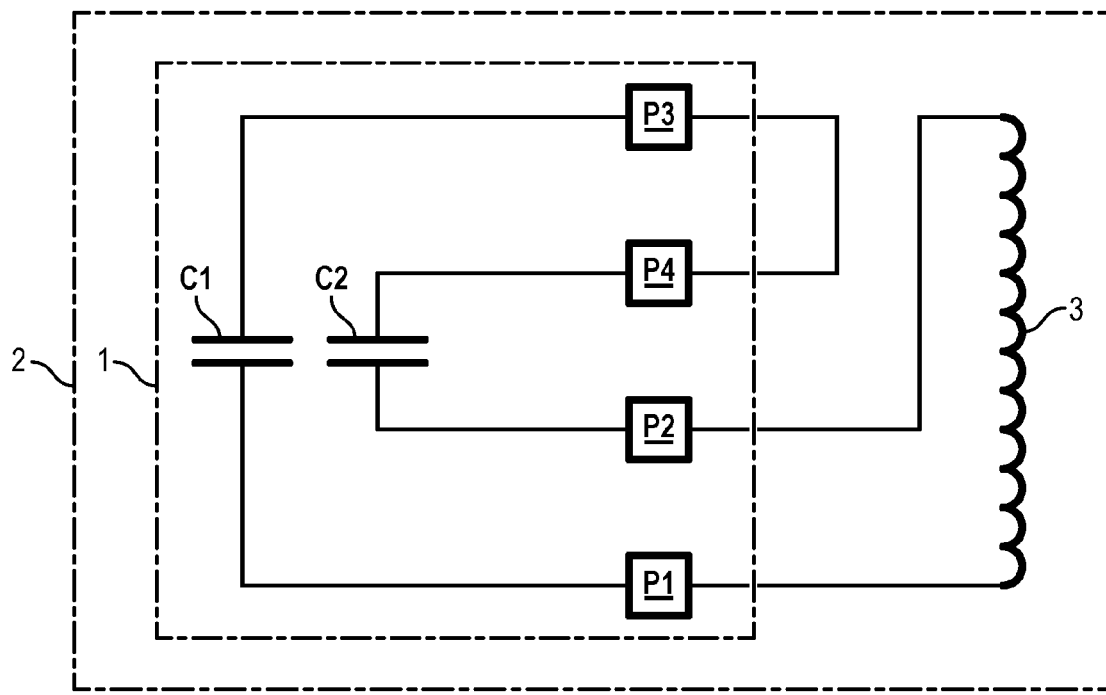
FIG. 7 illustrates a microelectronic chip according to a fifth embodiment of the invention.

An example of such a configuration is illustrated on FIG. 7 in which, as in the examples illustrated on FIGS. 3 to 6, the chip 1 includes an additional fourth contact P4 and all the contacts are under the form of external connectors. In this example the antenna 3 is connected between the first contact P1 and the second contact P2, and the second capacitor C2 is connected to the third contact P3 through the fourth contact P3 and a wire connecting the latter with the third contact P3.

Such a configuration is though fully achievable with only three contacts, in which case the fourth contact P4 does not exist and the second capacitor C2 is then directly connected to the third contact P3. Similarly, the third contact, and the fourth contact if any, do not need to be under the form of external connectors since they are not directly connected to any component located outside the chip.

The tuning capacitor C1 enables bringing the circuit into resonance. The capacitor C2 increases the efficiency of the antenna 3 by enabling tuning of the resonance frequency of the circuit. Therefore, it increases the amount of energy transmitted to the chip. Such a circuit with a capacitor in series is only possible thanks to the position of this capacitor between the third contact P3 connected to the inputs/outputs of the microprocessor and the second contact P2 distinct from the contacts connected to the inputs/outputs of the microprocessor. Would the chip include only two contacts, both connected to the inputs/outputs of the microprocessor, such a layout in series would only be possible by including the second capacitor on the electronic module, therefore decreasing the available space for the antenna 3. The antenna could then be too small for ensuring a proper power supply of the chip.

Figure 8:
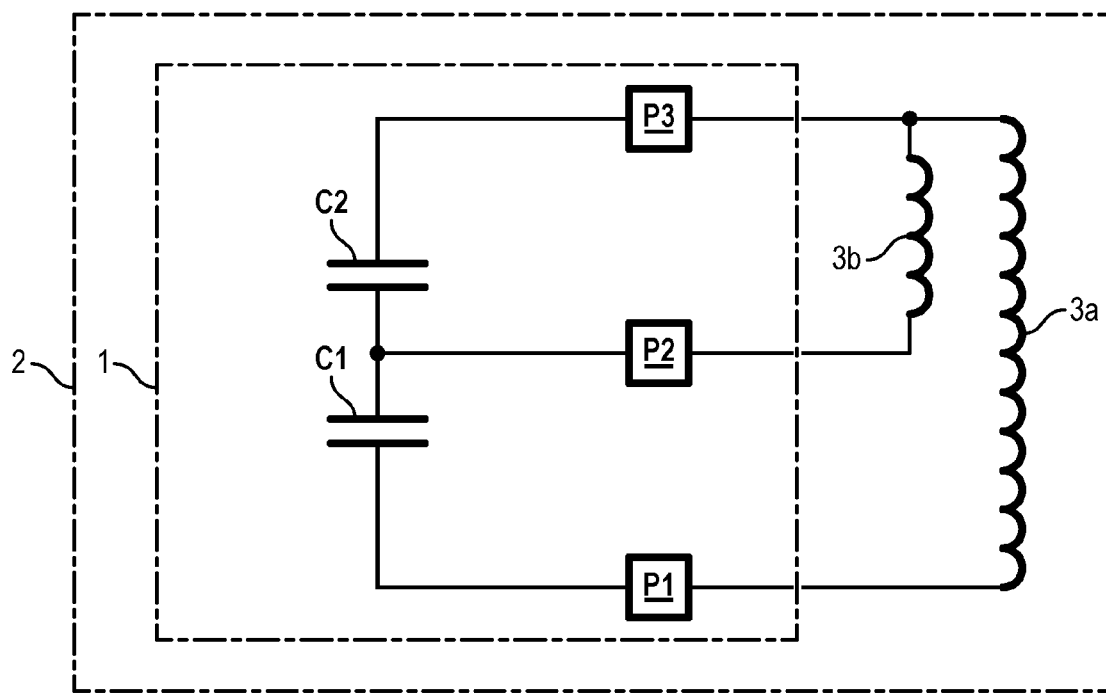
FIG. 8 illustrates a microelectronic chip according to a sixth embodiment of the invention.

A sixth example of configuration is illustrated on FIG. 8 in which the chip only includes three contacts. The first contact and the third contact are then connected to the inputs/outputs of the microprocessor, the first capacitor C1 is connected between the first contact P1 and the second contact P2, the second capacitor C2 is connected between the second contact P2 and the third contact P3. The electronic module includes an antenna 3a connected between the first contact P1 and the third contact P3, and a second antenna 3b is connected between the second contact P3 and the third contact P3. In this example, the first capacitor C1 is used as a tuning capacitor for the antennas and the second capacitor C2 amplifies the energy captured by the antennas and delivered to the chip.

Such a microelectronic chip thus enables different circuits ensuring a proper power supply of the chip, with no need of any antenna in the body of the smart card, while meeting the constraint of a small available area induced by the short dimensions of the electronic module in which the chip is included.

The invention claimed is:

1. Electronic module for a contactless smart card or dual contact and contactless smart card comprising at least a first antenna, a second antenna, a third antenna and a microelectronic chip, characterized in that:

said microelectronic chip comprises a microprocessor, at least a first contact, a second contact, a third contact, a fourth contact, a first tuning capacitor connection between, the first contact and the third contact, a second capacitor connected between the second contact and the fourth contact, said first and third contacts being connected to the inputs/outputs of the microprocessor and being configured to transmit to said microprocessor a radio-frequency communication signal exchanged through the antennas, said first antenna is connected between the first contact and the third contact and is configured to be brought into resonance by said first capacitor, said second antenna is connected between the second contact and the fourth contact and is configured to be brought into resonance by said second capacitor in order to capture the energy transmitted by induction by a remote reader, said third antenna is connected in series with said second antenna between the second contact and the fourth contact for transmitting the captured energy to the microelectronic chip and is coupled with the first antenna for transferring to the microelectronic chip through the first antenna the energy captured by the second antenna, and wherein said third antenna is magnetically coupled to said first antenna.

2. Electronic module according to claim 1, wherein the second capacitor is a variable capacitor.

3. Electronic module according to claim 1, wherein the microelectronic chip comprises a variable resistor connected in series with the second capacitor between the second contact and the fourth contact.

* * * * *